United States Patent [19]
Rynne

[11] Patent Number: 5,859,469
[45] Date of Patent: Jan. 12, 1999

[54] USE OF TUNGSTEN FILLED SLOTS AS GROUND PLANE IN INTEGRATED CIRCUIT STRUCTURE

[75] Inventor: D. Michael Rynne, Saratoga, Calif.

[73] Assignee: Advanced Micro Devices, Inc., Sunnyvale, Calif.

[21] Appl. No.: 897,166

[22] Filed: Jul. 18, 1997

[51] Int. Cl.$^6$ .................................................. H01L 29/00
[52] U.S. Cl. .......................... 257/592; 257/572; 257/576; 257/587; 257/598; 257/571; 257/588; 257/621; 257/520; 438/666; 438/667
[58] Field of Search .................................. 257/572, 576, 257/587, 592, 571, 588, 621, 573, 520, 517; 438/666, 667

[56] References Cited

U.S. PATENT DOCUMENTS

| | | | |
|---|---|---|---|
| 4,292,642 | 9/1981 | Appels et al. | 357/13 |
| 4,409,606 | 10/1983 | Wagenaar et al. | 357/13 |
| 4,533,430 | 8/1985 | Bower | 156/643 |
| 4,534,824 | 8/1985 | Chen | 156/628 |
| 4,579,812 | 4/1986 | Bower | 430/313 |
| 4,621,414 | 11/1986 | Iranmanesh | 29/576 W |
| 4,626,317 | 12/1986 | Bonn | 156/643 |
| 4,733,287 | 3/1988 | Bower | 357/34 |
| 4,745,087 | 5/1988 | Iranmanesh | 437/69 |
| 4,749,661 | 6/1988 | Bower | 437/33 |
| 4,771,418 | 9/1988 | Narasimhan et al. | 370/58 |
| 4,795,721 | 1/1989 | Bower et al. | 437/67 |
| 4,803,176 | 2/1989 | Bower | 437/33 |
| 4,860,082 | 8/1989 | Moriyama et al. | 357/49 |
| 4,868,631 | 9/1989 | Hollingsworth et al. | 287/572 |
| 4,933,733 | 6/1990 | Iranmanesh et al. | 357/72 |
| 5,208,169 | 5/1993 | Shah et al. | 437/31 |
| 5,268,312 | 12/1993 | Reuss et al. | 437/30 |
| 5,294,825 | 3/1994 | Nakagawa et al. | 257/487 |
| 5,386,140 | 1/1995 | Matthews | 257/592 |
| 5,485,029 | 1/1996 | Crabbe et al. | 257/501 |
| 5,496,746 | 3/1996 | Matthews | 437/31 |
| 5,548,155 | 8/1996 | Yoshihara | 257/588 |
| 5,554,872 | 9/1996 | Baba et al. | 257/342 |
| 5,565,697 | 10/1996 | Asakawa et al. | 257/347 |
| 5,717,241 | 2/1998 | Mahli et al. | 257/273 |

Primary Examiner—Tom Thomas
Assistant Examiner—Fetsum Abraham
Attorney, Agent, or Firm—H. Donald Nelson

[57] ABSTRACT

A semiconductor device having the base and collector surrounded by a continuous tungsten filled slot as ground plane. The portion of the tungsten filled slot over the buried layer extends beyond the surface of the buried layer and the portion of the tungsten filled slot not over the buried layer extends beyond the interface between the epitaxial layer and the substrate.

5 Claims, 7 Drawing Sheets

USE OF TUNGSTEN FILLED SLOTS AS GROUND PLANE IN INTEGRATED CIRCUIT STRUCTURE

BACKGROUND OF THE INVENTION

1. Cross Reference to Related Applications

This application is related to Application, Ser. No. 08/897, 165, filed on the filing date of this application, entitled REDUCTION OF DEPLETION SPREADING SIDEWAYS UTILIZING SLOTS, Application, Ser. No. 08/897,265, filed on the filing date of this application, entitled ELIMINATION OF RADIUS OF CURVATURE EFFECTS ON P-N JUNCTION AVALANCE BREAKDOWN USING SLOTS, Application, Ser. No. 08/897,167, filed on the filing date of this application, entitled USE OF MULTIPLE SLOTS SURROUNDING BASE REGION OF A BIPOLAR JUNCTION TRANSISTOR TO INCREASE CUMULATIVE BREAKDOWN VOLTAGE and Application, Ser. No. 08/897,082, filed on the filing date of this application, entitled USE OF SLOTS IN DEEP ISOLATION AND COLLECTOR PICKUP REGIONS FOR MINIMIZATION OF SUB-COLLECTOR UP-DIFFUSION.

2. Field of the Invention

This invention relates generally to high voltage semiconductor devices. More particularly, this invention relates to high voltage bipolar semiconductor devices having tungsten filled slots as ground plane that reduce high frequency signal degradation and parasitic signal propagation.

3. Discussion of the Related Art

The bipolar transistor is an electronic device with two pn-junctions in very close proximity. There are three device regions: an emitter region, a base region, and a collector region. The two pn-junctions are known as the emitter-base (EB) junction and the collector-base (CB) junction. Modulation of the current in one pn-junction by means of a change in the bias of the other nearby pn-junction is called bipolar-transistor action. Because the mobility of minority carriers (electrons) in the base region of npn transistors is higher than that of holes in the base of pnp transistors, higher frequency operation and higher speed performances can be obtained with npn devices. For this reason, the following discussion will be in terms of npn transistors but it is to be understood that the discussion is applicable to pnp transistors as well.

The desired device characteristics of bipolar transistors include: high current gain, high frequency ac operation, fast switching speed, high device-breakdown voltages, minimum device size (to achieve high functional density) and high reliability of device operation. In order for high-frequency ac performance and fast switching speed to be achieved, the parasitic resistances of the transistor; $R_E$, $R_B$, and $R_C$, and the parasitic junction capacitances; $C_{EB}$, $C_{CB}$, and $C_{CB}$ must be minimized. In addition, high-level injection effects, for example, the Kirk effect should be avoided. For faithful amplification of ac signals, the Early voltage must be high.

Another factor that must be considered in transistors are the errors due to parasitic signal propagation. As the semiconductor devices are being shrunk to meet the needs of consumers and to satisfy the increasing demand for faster and faster semiconductor devices, the errors due to parasitic signal propagation and high frequency signal degradation are becoming more and more critical.

The ground planes typically used today for applications such as analog circuits are the silicon substrates under the active region on the surface on which the transistors/circuits are located. The ground plane is then contacted with a backside contact.

In complex circuits with many interconnected transistors, a ground plane can eliminate resonances causing signal attenuation or non-linearity that is critical for analog applications, and in more general terms reduce electrical noise. This type of extraneous signal propagation occurs via the substrate.

A second path for extraneous signal propagation occurs between the interconnect lines. The use of a ground plane allows reduction of cross-talk or noise generation on adjacent interconnect lines; the electric field radiating from a signal line terminates on the ground plane rather than coupling to an adjacent line. With a complete ground plane, interconnect lines with controlled impedances can also be achieved. This becomes increasingly important as the frequencies at which signals propagate increase leading to enhanced sensitivity of an interconnect line to its surroundings. While the problems discussed above play a critical role in high frequency analog circuits, they are becoming significant issues for digital applications operating at very high clock frequencies.

U.S. Pat. No. 5,485,029 to Crabbe et al. describes an on-chip ground plane for reducing high frequency signal degradation and parasitic signal propagation. The ground plane in Crabbe et al. is a buried low resistivity semiconductor region in a plurality of non-device regions of the chip with reach-through regions electrically connected to the buried low resistivity semiconductor region. A front-side contact is electrically connected to the reach-through regions for electrically coupling the reach-through regions and the buried low resistivity semiconductor region to a ground potential to electrically ground the on-chip ground plane.

The drawback to the prior art device disclosed in Crabbe et al. is that isolation structures are still needed and the reach-through regions require additional space on the chip.

Therefore, what is needed is a semiconductor device with an on-chip ground plane that does not require additional space on the chip and that is effective in reducing high frequency signal degradation and parasitic signal propagation.

SUMMARY OF THE INVENTION

The present invention is directed to a semiconductor device having a base region that is surrounded by a tungsten filled slot as ground plane.

The base region and the surrounding slot are formed in an epitaxial region of the semiconductor device. The semiconductor device has a buried layer formed on a portion of the interface between the epitaxial region and a substrate region.

The semiconductor device also has a collector region surrounded by a tungsten filled slot as ground plane. The slot surrounding the base region and the slot surrounding the collector region form a single continuous slot. The portion of the slot over the buried layer extends just beyond the surface of the buried layer and is insulated from the buried layer by a liner material in the slot. The portion of the slot not over the buried layer extends just beyond the interface between the epitaxial layer and the semiconductor substrate.

The base region terminates on the surface of the slot surrounding the base region. The base region terminates on the surface of the slot substantially perpendicularly to the surface of the slot.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DETAILED DESCRIPTION

Reference is now made in detail to a specific embodiment of the present invention that illustrates the best mode presently contemplated by the inventor for practicing the invention and which is set forth in the accompanying drawings. The drawings referred to in this description are diagrammatic and, for clarity, are not drawn to scale. The drawings illustrate only one portion of an integrated circuit fabricated in accordance with the present invention. For each of the descriptions provided below, a typical manufacturing process is given for each step. It should be appreciated that other manufacturing processes could be used and other manufacturing processes would become apparent to a person skilled in the art and, therefore, the recitation of a particular manufacturing process should not be construed to be limiting. It is noted that in some instances conventions such as p– and n+ are given by way of example, in which case the concentrations are not critical to the implementation of the present invention. The corresponding dopant types and concentrations would be apparent to a person skilled in the relevant art. For those instances in which the concentration is critical to the implementation of the present invention, the value of the concentration is specified.

FIGS. 1–4 show selected initial steps in the manufacture of a standard-buried-collector (SBC) npn semiconductor device. The selection of an SBC npn semiconductor device is for convenience only and is not meant to restrict the invention only to SBC npn semiconductor devices as the concepts of the present invention are applicable to other types of semiconductor devices. FIGS. 5–8 show selected continuing steps in the manufacture of the semiconductor device shown in FIGS. 1–4 in which a semiconductor device as known in the prior art is formed. FIGS. 9–13 show selected continuing steps in the manufacture of the semiconductor device shown in FIGS. 1–3 in which a semiconductor device in accordance with the present invention is formed. In the figures, there has not been an attempt to show any of the features to an exact scale. In addition, the vertical dimension is somewhat larger so that the junctions and film thicknesses are actually smaller than they appear in the figures in relation to the horizontal dimension of the various elements.

Figure 1:
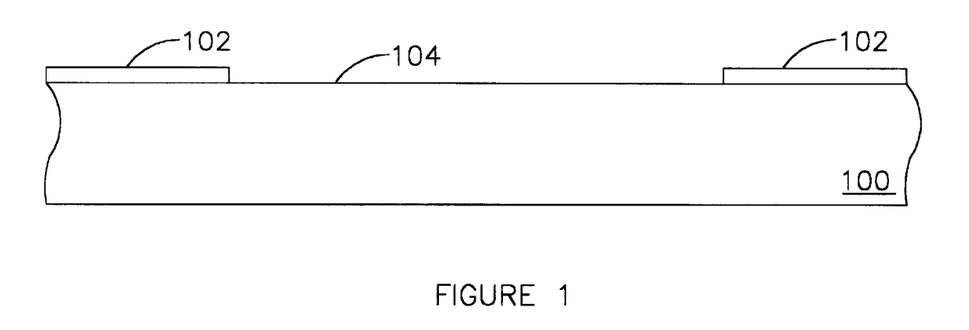
FIGS. 1–4 show selected initial steps in the manufacture of a semiconductor device.

FIG. 1 shows a lightly p-type doped silicon substrate 100 with an oxide layer 102 that has been formed on the surface of the substrate 100 and etched to expose a portion of the surface 104 of the substrate 100. The oxide layer 102 is typically formed by exposing the surface of the substrate 100 to a wet oxidation atmosphere and a high temperature cycle. The substrate doping is selected to be light enough to minimize the parasitic collector-to-substrate depletion-layer capacitance, but heavy enough to prevent it from being changed to n-type during subsequent processing.

Figure 2:
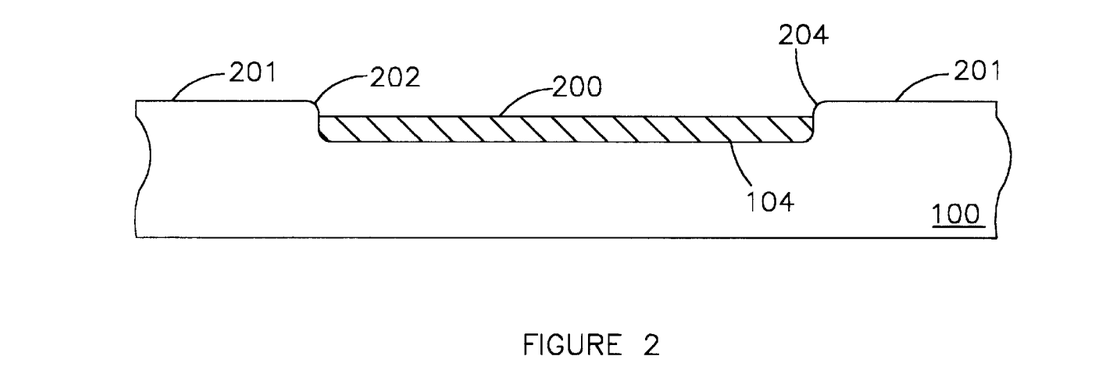

FIG. 2 shows the portion of the substrate 100 shown in FIG. 1 with a layer 200 formed in the portion of the surface 104 defined by the oxide layer 102 shown in FIG. 1 in which a window has been etched. The layer 200 is formed by heavy n+ type diffusion or ion implantation and will become a buried layer during further processing. The buried layer is also called a subcollector. The surface 104 of the substrate 100 is exposed to an appropriate atmosphere containing the selected dopant ions or an ion implantation at approximately 30 keV and approximately $10^{15}$ atoms/cm$^2$ is done. In order to minimize the further diffusion of the layer 200 during subsequent processes that are conducted at high temperature, dopants with relatively small diffusion constants such as arsenic and antimony are used to form the layer 200. The highly doped layer 200 provides a low resistance path from the active part of the transistor, to be discussed later, to the collector contact, which will also be discussed later. The oxide layer 102 is removed exposing the surface 201 of the substrate 100. An anneal/drive-in procedure is performed in an oxidizing ambient that causes a new oxide to be formed on the wafer surface. After the diffusion to form the layer 200 a step of approximately 100–200 nm remains in the substrate 100 at the edges of the layer 200. The step is indicated at 202 and 204 and is formed because of the unequal thicknesses of the oxides that have grown on the respective underlying materials. The step propagates through the epitaxial layer and becomes the alignment mark that allows subsequent mask levels to be aligned with the buried layer.

Figure 3:
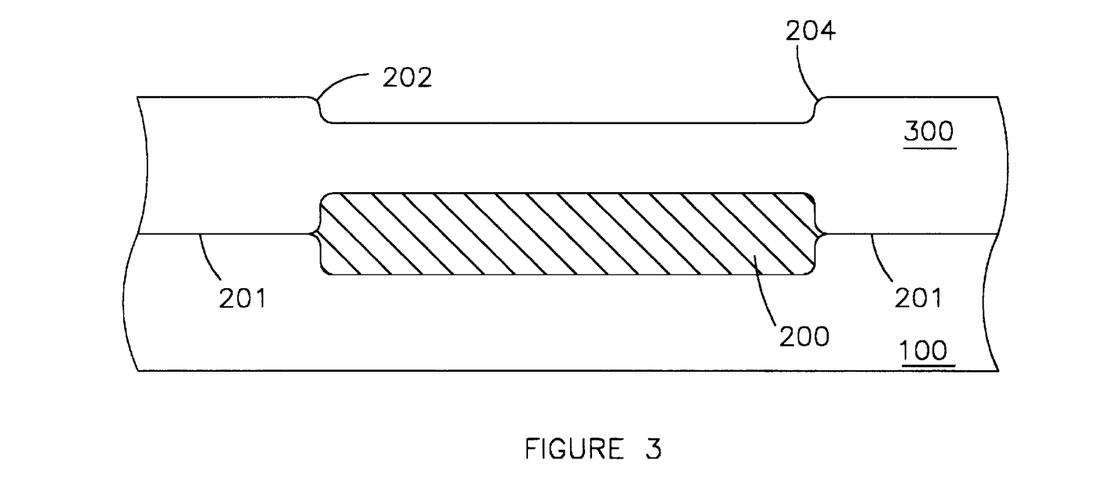

FIG. 3 shows an epitaxial layer 300 grown on the surface of the entire wafer, including the surface 201 of the substrate 100 and the surface of the layer 200. The epitaxial layer 300 is a lightly doped n-type layer and under proper conditions the epitaxial layer 300 is a single-crystal layer that continues the crystal structure of the original substrate. This makes the epitaxial layer 300 suitable for the fabrication of devices. The dopant typically used to form the lightly doped (approximately $10^{15}$–$10^{16}$ atoms/cm$^3$) n-type epitaxial layer is arsenic because of its small diffusivity. The minimum thickness and maximum doping concentration of the epitaxial layer are determined by the avalanche breakdown and reach through limitations on the value of $BV_{CE0}$. During the growth of the epitaxial layer the step indicated at 202, 204 is shown replicated on the surface of the epitaxial layer 300. The presence of the step allows subsequent mask levels to be aligned to the layer 200, which is now buried. During the growth of the epitaxial layer 300, which is done at a high temperature, the buried layer 200 becomes larger because of diffusion of the dopants used to form the buried layer 200.

As discussed above, dopants with a low diffusion rate are typically used to minimize the subsequent growth of the buried layer 200.

Figure 4:
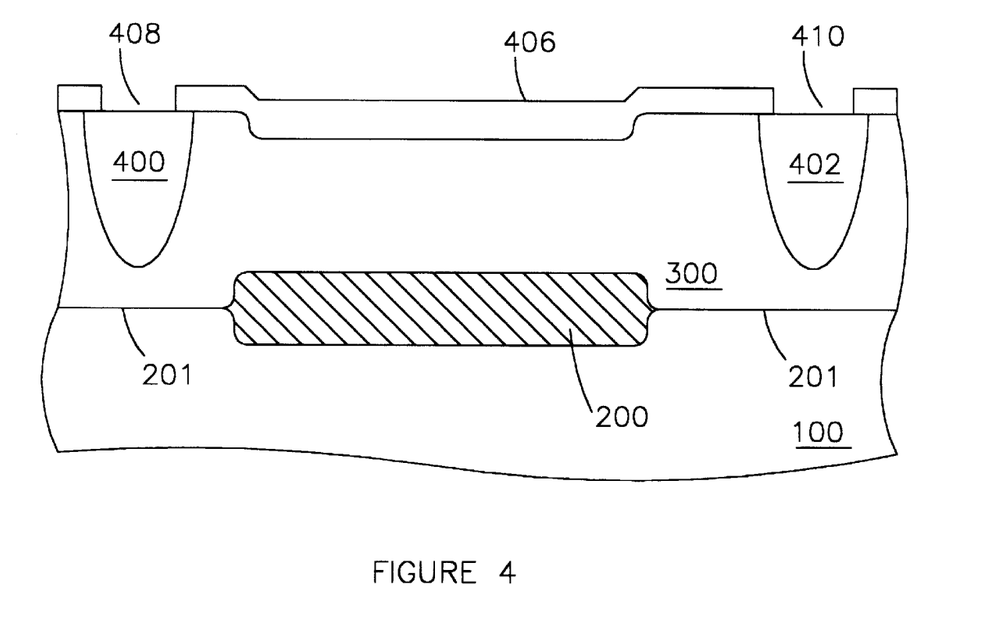
Figure 5:
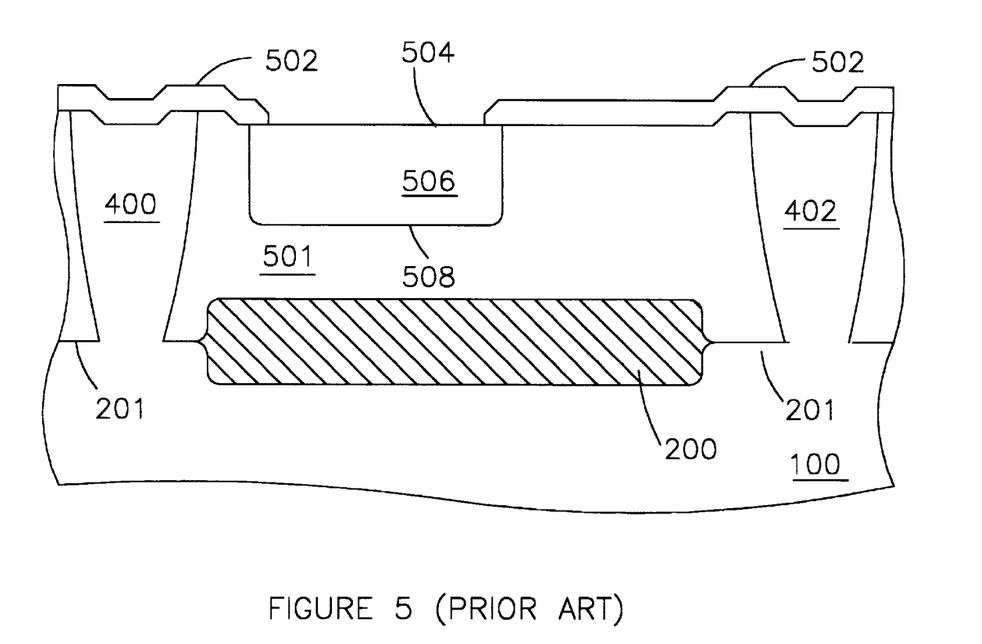
FIGS. 5–8 show selected continuing steps in the manufacture of the semiconductor device shown in FIGS. 1–4 to obtain a prior art semiconductor device.

FIG. 4 shows two isolation structures 400 and 402 formed in the epitaxial layer 300. The isolation structures are formed by growing an oxide layer 406 on the surface of the epitaxial layer 300 and opening windows, indicated at 408 and 410 in the oxide layer 406 at locations where isolation structures are to be formed. A deep p+ type diffusion process, typically using boron, is then performed. The purpose of the isolation structures is to isolate the collectors of the transistors from one another with reverse-biased pn junctions. Thus, the acceptor concentration in the isolation regions must be higher than the donor concentration in the epitaxial layer, and the junction depth (the depth of the isolation structures) must be at least equal to the depth of the epitaxial layer in order for complete isolation to be achieved. As shown in FIG. 4, p+ isolation structures 400 and 402 are formed. Initially, the p+ isolation structures 400 and 402 do not extend to the substrate layer 100. However, subsequent high-temperature processes will cause the p+ isolation diffusion making up the isolation structures 400 and 402 to reach as far as the original substrate surface 201 as shown in FIG. 5. It is customary to "overdrive" the isolation diffusion beyond the depth of the epitaxial layer to prevent the possibility that the depletion region could extend beneath the isolation diffusion. Once the p+ isolation diffusion reaches or extends beyond the original substrate layer, there will be an n-type island completely surrounded by p+ type material. This can be clearly seen in FIG. 5. It should be appreciated by one of ordinary skill in the art that the figures show a cross-section of the device and the structures are all three-dimensional. For example, it should be appreciated that the isolation structures indicated at 400 and 402 surround the region 500 of the device shown in FIG. 5.

FIG. 5 shows the device shown in FIG. 4 with the oxide layer 406 removed and a new oxide layer 502 formed on the device. A base diffusion mask is used to open a window 504 in the oxide and a p-type diffusion process is performed to form the base region 506 of the transistor. The formation of the base region is one of the most critical processes in bipolar transistor fabrication. The base must be aligned so that the collector-base and collector-substrate depletion regions do not merge, following diffusion at the surface. The minimum allowable spacing between the isolation regions and the base region is determined from knowledge of the applied voltages and the epitaxial-layer doping concentration. The collector-base junction 508 does not reach as far as the buried layer 200. As a result the region 501 between the base region 506 and the buried layer 200 remains lightly doped, which gives more ideal characteristics for the transistor including a high breakdown voltage.

Figure 6:
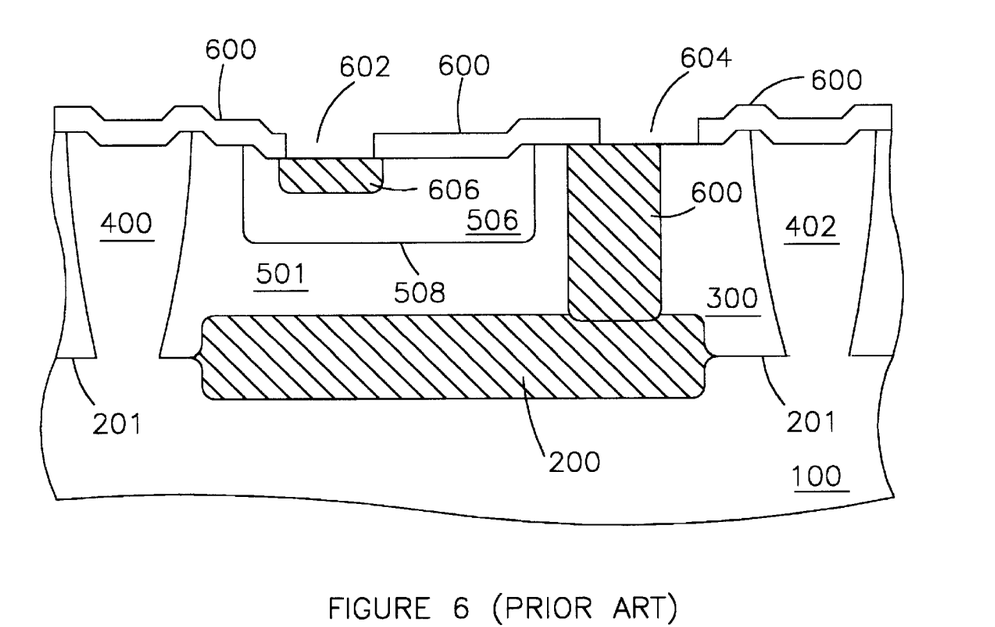

FIG. 6 shows the device shown in FIG. 5 with the oxide layer 502 removed and a new oxide layer 600 formed on the surface of the device. In one type of prior art device, a window at 602 is opened in the oxide layer 600 for an emitter diffusion process and a window at 604 is opened at the same time in the oxide layer 600 for a collector diffusion process. In this type of device, the combined emitter and collector diffusion process is a shallow, high-concentration n-type diffusion and is performed in an oxidizing ambient so that oxide covers the entire wafer after the diffusion is completed. In another type of device, the emitter diffusion and collector diffusion process shown in FIG. 6 are done in separate diffusion processes. If the collector region 608 is to extend to the buried layer 200 it may be necessary to have the emitter diffusion process separate from the emitter diffusion process so that the emitter diffusion does not diffuse too deeply into the base region 506. The deep diffusion of the collector region (also called a plug or sinker) is necessary in some applications because the value of the $R_c$ (the resistance of the collector to base path) is too high. In junction-isolated SBC devices, the collector contact is typically formed by means of a diffusion process. In other types of devices, an ion implantation process could be used. Phosphorus is chosen for this application since it is a faster-diffusing impurity than arsenic. As can be appreciated, an additional mask must be used to allow the dopant to be selectively introduced only into the collector region. The emitter diffusion process forms the emitter region 606 and the collector diffusion process forms the collector region 608.

Figure 7:
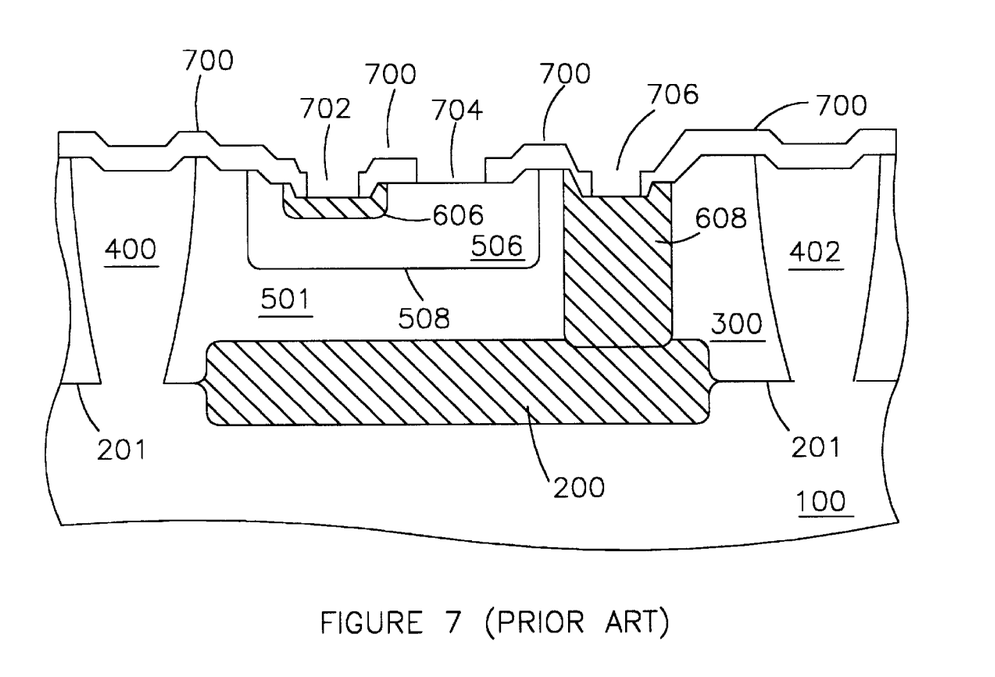

FIG. 7 shows the device shown in FIG. 6, after a contact mask has been used to open windows in the oxide layer 700 that has been formed on the device. There is a window 702 to the emitter region 606, a window 704 to the base region 506, and a window 706 to the collector region 608. The windows 702, 704, and 706 are for the purpose of allowing electrical contacts to be made to the emitter region 606, the base region 506 and the collector region 608.

Figure 8:
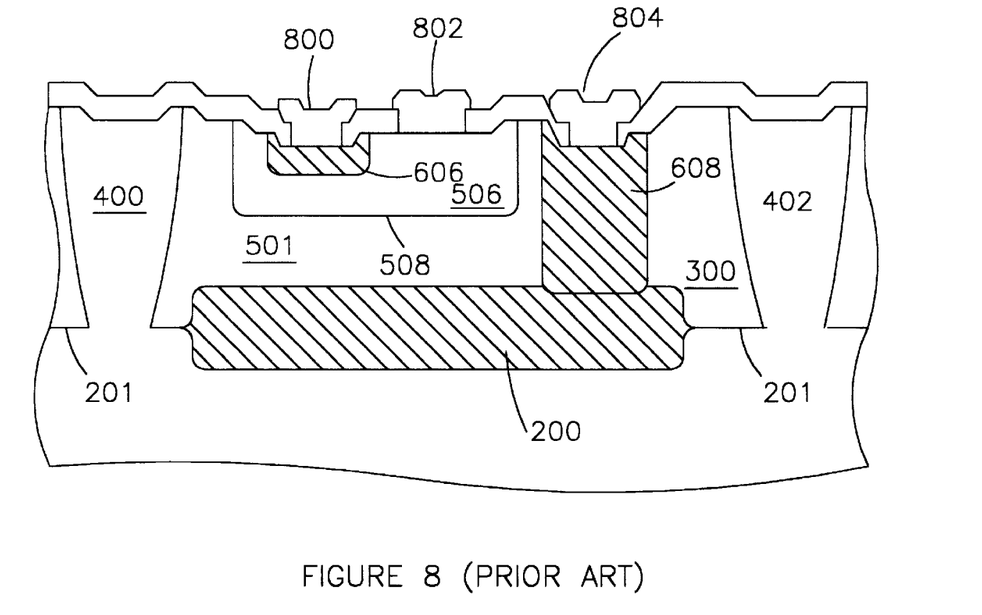

FIG. 8 shows the device shown in FIG. 7, with an electrical contact 800 to the emitter region 606, an electrical contact 802 to the base region 506, and an electrical contact 804 to the collector region 608.

Figure 9:
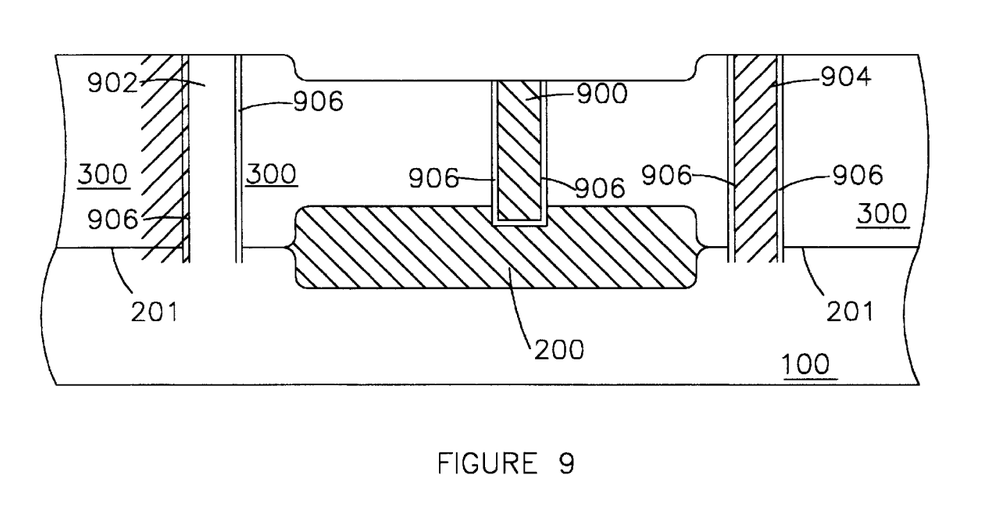
FIGS. 9–13 show selected continuing steps in the manufacture of the semiconductor device shown in FIGS. 1–3 to obtain a semiconductor device in accordance with the present invention.

FIG. 9 shows the device shown in FIG. 3 with a slot 900 formed in the region 300. The depth of the slot is selected so that it will extend just beyond the surface of the buried layer 200. A slot is also formed in the region 300 with a portion of the slot indicated at 902 and a portion of the slot indicated at 904. The portions of the slot 902 and 904 are portions of a continuous slot formed around a portion of the region 300. The depth of the portions 902 and 904 of the slot is selected so that it will extend just beyond the surface 201 of the substrate 100. One method of forming the slots is to provide a protection layer consisting of a layer of thermal oxide, a deposited layer of silicon nitride, and a deposited layer of oxide. A layer of photoresist is deposited and a photoresist mask patterns the photoresist and a reactive ion etch (RIE) with chemistry etches through the protection layer, the oxide and nitride to the photoresist. The photoresist is removed and reactive ion etching with chemistry is used to etch the silicon slots. A liner material 906 is formed on the walls of the slots. The liner material depends upon the slot material and could be thermal oxide or silicon nitride. The slot is filled with tungsten and planarized using a chemical mechanical planarization process. Any well-known method of making slots in a silicon device can be used to form the slots. The bottoms of the portions 902 and 904 of the slot that extends into the substrate 100 do not have the liner material 906. This allows the tungsten material in the slot to be in electrical contact with the substrate 100.

Figure 10:
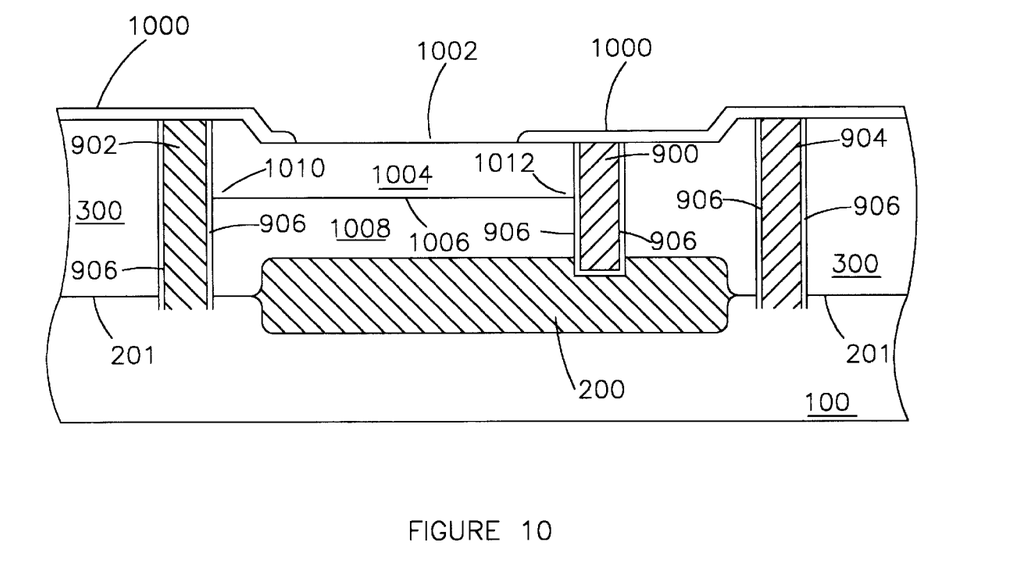

FIG. 10 shows the device shown in FIG. 9 with an oxide layer 1000 formed on the device. A base diffusion mask is used to open a window 1002 in the oxide layer 1000 and a p-type diffusion process is performed to form the base region 1004 of the transistor. The p-type diffusion process to form the base region 1004 is controlled to ensure that the base region boundary 1006 (which becomes the collector-base junction) does not reach as far as the buried layer 200. As a result, the region 1008 between the base region 1004 and the buried layer 200 remains lightly doped, which provides a device with more ideal characteristics for the transistor and also provides a higher breakdown voltage. The base diffusion process performed within the slot portion 902 and the slot 900 provides a collector-base junction 1006 that is substantially completely planar; that is, with substantially no spherical or cylindrical curvature such as in prior art devices. The collector-base junction 1006 terminates substantially perpendicular to the slot portion 902 and the slot 900. The perpendicular termination is indicated at 1010 and 1012.

Figure 11:
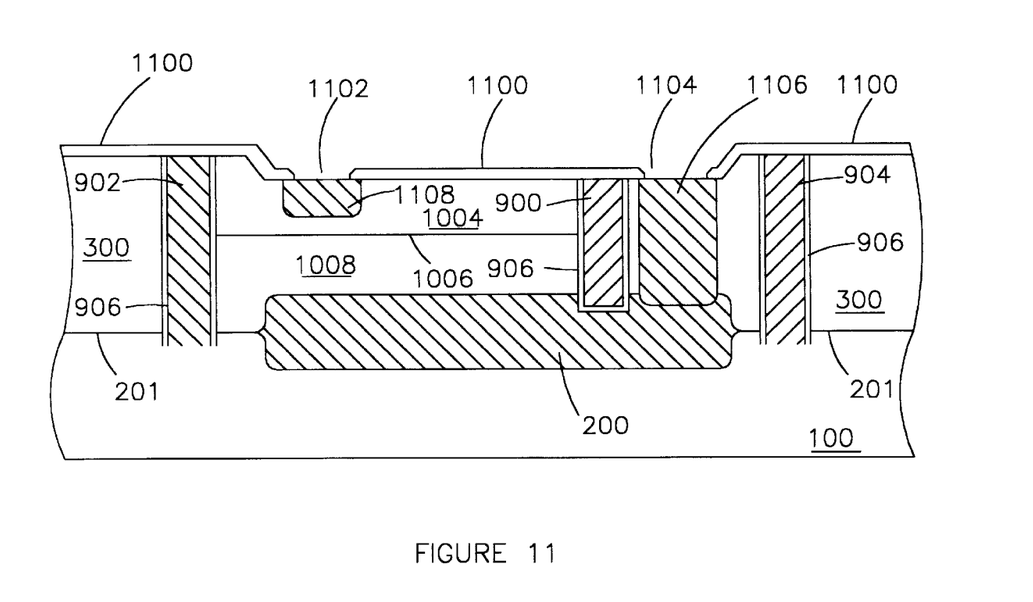

FIG. 11 shows the device shown in FIG. 10, with the oxide layer 1000 removed and a new oxide layer 1100 formed on the surface of the device. In one type of device, a window at 1102 is opened in the oxide layer 1100 for an emitter diffusion process and a window at 1104 is opened at the same time in the oxide layer 1100 for a collector diffusion process. In such a device, the combined emitter and collector diffusion process is a shallow, high-concentration n-type diffusion and is performed in an oxidizing ambient atmosphere so that an oxide layer covers the entire wafer after the diffusion is completed. In another type of device, the emitter diffusion and the collector diffusion process are done in separate diffusion processes. If the collector region 1106 is to extend to the buried layer 200 it may be necessary to have the emitter diffusion process done separately from the emitter diffusion process so that the emitter diffusion does not diffuse too deeply into the base region 1004. The deep diffusion of the collector region 1106 is necessary in some applications because the value of the $R_C$ (the resistance of the collector-to-base path) is too high if a deep diffusion is not done. The deep diffusion of the collector region is also called a plug or sinker. In junction-isolated SBC devices, the collector contact is typically formed by means of a diffusion process. In other types of devices, an ion implantation process could be used. Phosphorus is chosen for this application since it is a faster-diffusing impurity than arsenic. As can be appreciated, an additional mask must be used to allow the dopant to be selectively introduced only into the collector region. The emitter diffusion process forms the emitter region 1108 and the collector diffusion process forms the collector region 1106.

Figure 12:
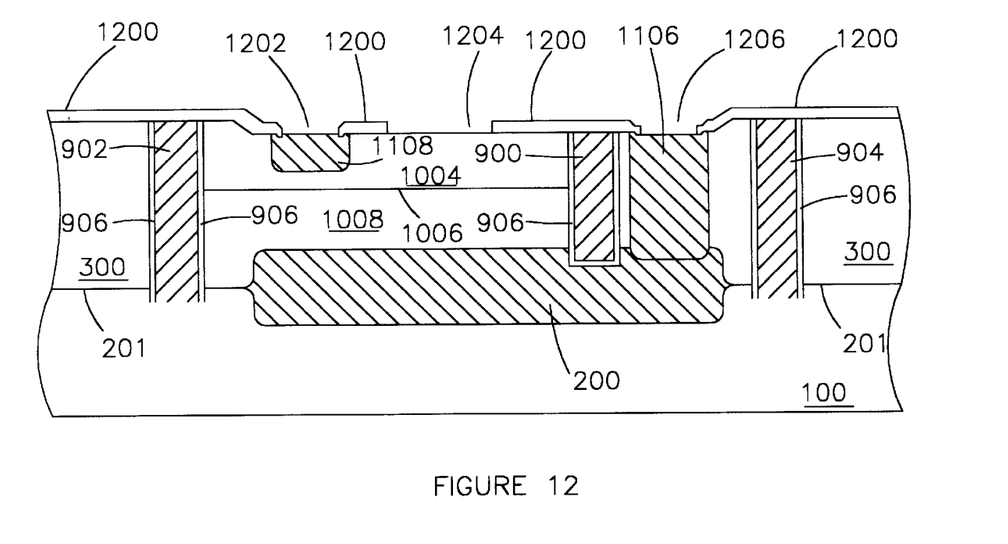

FIG. 12 shows the device shown in FIG. 11, after the oxide layer 1100 has been removed and a new oxide layer 1200 formed on the surface of the device. FIG. 12 shows the new oxide layer 1200 after a contact mask has been used to open windows in the oxide layer 1200. There is a window 1202 to the emitter region 1108, a window 1204 to the base region 1004, and a window 1206 to the collector region 1106.

Figure 13:
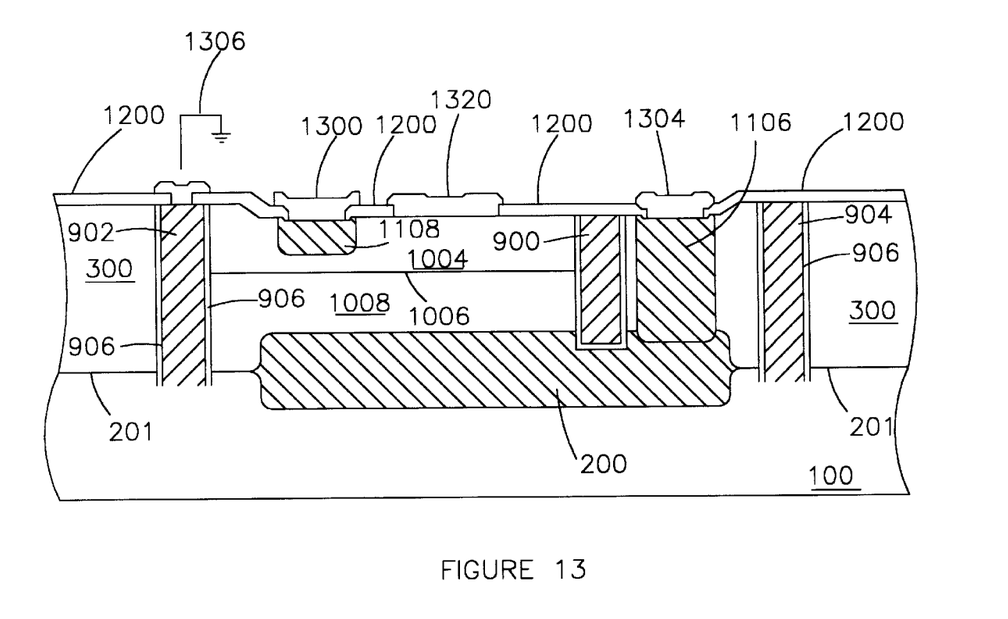

FIG. 13 shows the device shown in FIG. 12 with an electrical contact 1300 to the emitter region 1108, an electrical contact 1302 to the base region 1004, and an electrical contact 1304 to the collector region 1106. Also shown is a ground contact 1306 to slot portion 902. As can be appreciated, the slot is continuous and a single ground contact to any portion of the slot can ground the entire slot. The continuous nature of the slot can clearly be seen in FIG. 14.

Figure 14:
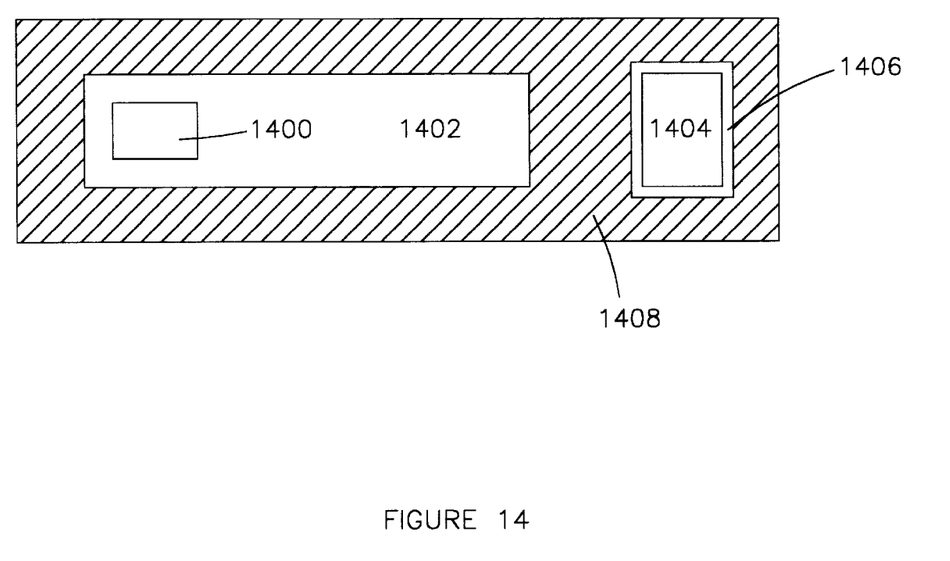
FIG. 14 is a plan view of a portion of a semiconductor device showing tungsten filled slots as ground plane.

FIG. 14 is a plan view of a portion of a semiconductor device fabricated in accordance with the present invention. An emitter region 1400 is shown in a base region 1402. A collector region 1404 is shown in a portion of the epitaxial region 1406. The base region 1402 and the collector region 1404 are surrounded by the continuous slot 1408.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A semiconductor device comprising:

a substrate;

an epitaxial region formed on said substrate;

base and collector regions formed in the epitaxial region;

a buried layer formed at an interface between said substrate and said epitaxial region;

tungsten filled slots of a continuous structure surrounding the base and the collector regions serving as ground planes such that said slots extend to said substrate beyond said interface.

2. The semiconductor device of claim 1, wherein a portion of the tungsten filled slots extend beyond an upper surface of the buried layer.

3. The semiconductor device of claim 1, wherein the tungsten filled slots comprise insulated walls and a bottom portion of the tungsten filled slot is lined with a material to insulate the tungsten filled slot from the buried layer.

4. The semiconductor device of claim 3, wherein the base region terminates on the surrounding slots.

5. The semiconductor device of claim 4, wherein a boundary of the base region terminates on the surface of the surrounding slots substantially perpendicular to a surface of the surrounding slot.

* * * * *